United States Patent
Hassel et al.

(10) Patent No.: US 9,035,664 B2
(45) Date of Patent: May 19, 2015

(54) DEVICE AND METHOD FOR MEASURING CURRENTS IN A BEARING

(75) Inventors: Jörg Hassel, Erlangen (DE); Gerd Michaelis, Möhrendorf (DE); Carsten Probol, Buckenhof (DE)

(73) Assignee: SIEMENS AKTIENGESELLSCHAFT, München (DE)

( * ) Notice: Subject to any disclaimer, the term of this patent is extended or adjusted under 35 U.S.C. 154(b) by 268 days.

(21) Appl. No.: 13/697,239

(22) PCT Filed: May 11, 2010

(86) PCT No.: PCT/EP2010/002905
§ 371 (c)(1),
(2), (4) Date: Nov. 9, 2012

(87) PCT Pub. No.: WO2011/141038
PCT Pub. Date: Nov. 17, 2011

(65) Prior Publication Data
US 2013/0049772 A1    Feb. 28, 2013

(51) Int. Cl.
G01R 27/26 (2006.01)
H02K 11/00 (2006.01)
G06K 9/00 (2006.01)
G01R 31/34 (2006.01)
H02K 5/16 (2006.01)

(52) U.S. Cl.
CPC .......... *H02K 11/001* (2013.01); *G01R 27/2605* (2013.01); *G06K 9/0002* (2013.01); *G01R 31/343* (2013.01); *H02K 5/161* (2013.01); *H02K 2211/03* (2013.01)

(58) Field of Classification Search
CPC .. G01R 27/2605; G01R 27/26; G01R 31/016; G01R 31/028; G01R 31/312; G01R 31/343; G01D 5/24; G01D 5/2417; G06K 9/0002; H02K 11/001; H02K 5/161; H02K 2211/03
USPC ......... 324/658, 661, 686, 649, 600, 548, 537, 324/519, 500, 750.17, 750.16; 702/47, 52
See application file for complete search history.

(56) References Cited

U.S. PATENT DOCUMENTS

| | | | |
|---|---|---|---|
| 3,176,286 A | 3/1965 | Dschen | |
| 3,506,912 A | 4/1970 | Braun | |
| 6,140,931 A * | 10/2000 | Yamane et al. | 340/686.6 |
| 6,297,465 B1 | 10/2001 | Groves | |
| 6,300,701 B1 | 10/2001 | Dymond et al. | |
| 8,610,591 B2 * | 12/2013 | Kretschmer et al. | 340/682 |

(Continued)

FOREIGN PATENT DOCUMENTS

| | | |
|---|---|---|
| DE | 102 42 310 A1 | 7/2003 |
| DE | 102004056996 A1 | 6/2006 |
| DE | 102005027670 A1 | 1/2007 |

(Continued)

*Primary Examiner* — Hoai-An D Nguyen
(74) *Attorney, Agent, or Firm* — Henry M. Feiereisen LLC

(57) ABSTRACT

A measuring method and a device that permit a better evaluation of bearing currents are disclosed. The method uses non-contact measurement of a bearing voltage. A non-contact voltage measurement is performed by means of a series circuit of capacitors. The bearing voltage can be detected especially well in this manner even in the high frequency range.

28 Claims, 4 Drawing Sheets

(56) References Cited

U.S. PATENT DOCUMENTS

2011/0175631 A1* 7/2011 Kretschmer et al. .......... 324/679
2012/0319723 A1* 12/2012 Hassel et al. ............. 324/765.01

FOREIGN PATENT DOCUMENTS

| DE | 102008035613 A1 | 1/2010 |
|---|---|---|
| EP | 2 110 831 A2 | 10/2009 |
| GB | 1191217 A | 5/1970 |
| RU | 2036462 C1 | 5/1995 |
| RU | 2242646 C2 | 12/2004 |
| SU | 1176419 A1 | 8/1985 |
| SU | 1197011 A1 | 12/1985 |
| WO | WO 2007106015 A1 | 9/2007 |
| WO | WO 2010007203 A1 | 1/2010 |
| WO | WO 2011/103883 A1 | 9/2011 |

* cited by examiner

DEVICE AND METHOD FOR MEASURING CURRENTS IN A BEARING

CROSS-REFERENCE TO RELATED APPLICATIONS

This application is the U.S. National Stage of International Application No. PCT/EP2010/002905, filed May 11, 2010, which designated the United States and has been published as International Publication No. WO 2011/141038.

BACKGROUND OF THE INVENTION

Electrical currents (bearing currents) can occur in bearings in machines which significantly reduce the lifetime of said bearings. Bearing currents are electrical currents which occur in roller bearings or plain bearings of electrical machines.

They are caused by electrical voltages (bearing voltages) which arise as a result of electrical or magnetic stray fields within the machine or foreign voltages which come from outside and flow across the machine. The current flow occurs as soon as the bearing voltage lies above the breakdown voltage of the lubricant.

Examples of the negative affects of bearing currents are as follows
  Grease burning (reduction of the remaining lubrication capability)
  Pit formation in the raceways and in the roller elements
  And in extreme cases, as consequential damage resulting from this: Formation of rifling in the raceways.

These bearing currents have been a known phenomenon for decades. They are not able to be detected directly in the field and lead to significant expense for users or to high warranty costs for manufacturers. There is thus great interest in a measurement method or sensors which measure bearing currents and are able to evaluate them in an informative manner.

Bearing currents on electrical machines, especially during operation with power electronics, can reduce the lifetime of the motor bearing to a fraction. According to the existing prior art bearings damaged by electrical bearing currents are only noticed and replaced when the damage becomes apparent e.g. when noise develops or bearing grease is burned. This often leads to system shutdowns, which are enormously costly.

A major problem in operating the bearing is thus that of recognizing the predicted time of the failure and thereby the optimum time for replacing the bearing. Reacting too early means unnecessarily high maintenance costs; reacting too late means that the user incurs system shutdown costs.

Bearing currents are currently detected by the complicated method of classical bearing current measurement, which makes it necessary to reconstruct the motor several times (dismantle and rebuild it), or detects them quantitatively by means of direct voltage measurement by contact brush. The frequency range covered in this case typically lies in the single or two-digit MHz range. A higher frequency range is not possible because of the boundary conditions of the installation. Furthermore permanent monitoring is only possible to a restricted extent.

Measurement via the emitted electromagnetic field is very prone to misinterpretation through coupled-in interference and barely allows quantification of the bearing currents. Despite the great efforts made, no suitable solution has been found over the years. According to the prior art, bearing currents are thus only to be quantified by experts. In such cases however the information provided is only meaningful to a restricted extent, because of the low frequency range, see for example a patent application submitted by the applicant under the file reference PCT/EP2010/001150 entitled "Verfahren zur Detektion von Plasma-Lagerströmen (Method for detection of plasma bearing currents)", or the sensitivity of the measurement of the emitted electromagnetic field to external interferers.

Sensor systems already exist for measuring electrical bearing currents in electrical machines (motors and generators).

In the classic measuring technique the bearing is isolated in relation to the motor housing. This isolation is bridged with a line. The bearing current can be measured for example with a current probe via this line.

A further option is described in publication DE 10 2005 027 670, indirect measurement via the bearing voltage and the calculation of the bearing current from the rapid voltage collapses during spark discharges. Measurement of the electromagnetic fields in the vicinity of the motor is also known for example from publication WO 2007106015.

A remedy for bearing currents and the bearing damage caused thereby is often associated with significant costs and can also only be assessed with difficulty in respect of whether it will be adequate. Cost-intensive measures have in the past in some cases still not led to the desired objective.

Classical bearing current measurement technique is expensive in terms of money and time. The motors must be dismantled and rebuilt in order to make the measurement possible.

Measurement via the bearing voltage generally requires coupling via contact brushes. These contact brushes are not maintenance-free and/or are expensive and thus not suitable for long-term monitoring. The installation of a contact brush is also in practice often only accepted for a short time by customers.

Measurements in the GHz range are difficult to implement since line lengths of individual wires must be very short.

The measurement of electromagnetic fields is generally sensitive to interference pulses from the environment, e.g. from switching of converters. As a result measurements are not recognized by engineers. Furthermore amplitude information is hardly possible since the attenuation is not defined by the propagation.

The object of the invention is to specify a solution for the problems cited above. A measurement method and a device are to be specified which allow a better assessment of the bearing currents. Furthermore a method and a device are to be specified which realize a non-contact measurement of bearing currents. The object of the invention is also to specify a measurement sensor and a method which is suitable for long-term measurement of bearing currents.

SUMMARY OF THE INVENTION

This object is achieved by a device for detecting a bearing current in a motor bearing or in a bearing of a machine driven by a motor which guides a motor shaft or drive shaft, whereby the shaft is connected to a motor containing a rotor and at least one housing part surrounding the rotor with a coupling or with an attachment suitable for the measurement.

The measurement is undertaken in a gap into which at least one board is inserted, which has a central insulation layer and which, on the sides of the board facing towards the inner surfaces of the gap, has layers with good electrical conductivity in each case. The measurement is undertaken in such cases by at least one board which is inserted between housing and coupling, and consists of a central insulation layer and, on the sides of the board facing towards the housing and the coupling, has layers with good electrical conductivity in each case.

In accordance with the invention, the object is also achieved by a method which measures bearing currents in a motor bearing which guides a motor shaft or drive shaft, wherein the shaft is connected electrically-conductively with a motor which contains a rotor and a housing at least partly surrounding the rotor. The motor shaft is connected to a coupling or to an attachment suitable for the measurement. At least one board is inserted into a gap present at the shaft or bearing housing, which has a central insulation layer and, on the sides of the board facing towards the inner surfaces, has layers with good electrical conductivity in each case.

The measurement is carried out in such cases on at least one board, which is inserted between housing and coupling and has a central insulation layer as well as, on the sides of the board facing towards the housing and the coupling, layers with good electrical conductivity in each case.

In accordance with the invention a non-contact voltage measurement is undertaken by a series circuit of capacitors. The bearing voltage can be detected especially well in this way even in the high-frequency range.

The bearing voltage is able to be detected in the GHz range outside the motor between the coupling and the motor housing by a non-contact voltage measurement. In addition, because of the distance between motor coupling and motor housing, which is usually small or can if necessary be reduced in any given manner, a very good signal-to-noise ratio between bearing current signal and interference signals from outside is present. The measurement is also especially immune to interference and thereby suitable for practical use.

The frequency range covered in conventional measurements has previously typically extended into the single or two-digit MHz range; a higher frequency range was not possible because of the boundary conditions of installation.

Previously measurements have only been meaningful to a restricted extent because of the low frequency range or the sensitivity of the measurement of the emitted electromagnetic field to external interference. The high-frequency range is however especially important in order to evaluate the harmfulness of the bearing currents. The new measurement probe is especially suitable for this.

Summary of the advantages:
Simple and rapid installation
Also suitable for short-term measurements by service personnel (portable service probe)
Wear-free
Suitable for detection into the GHz range
Relatively high interference immunity from irradiated fields.

Further advantageous embodiments are specified in the subclaims.

The new non-contact voltage measurement makes a simple and rapid installation as well as wear-free and inexpensive long-term measurement possible. The measurement principle also has good applicability in the high-frequency range, especially above 1 GHz.

BRIEF DESCRIPTION OF THE DRAWINGS

The invention is explained below with reference to the exemplary embodiments, in which.

DETAILED DESCRIPTION OF PREFERRED EMBODIMENTS

Figure 1:
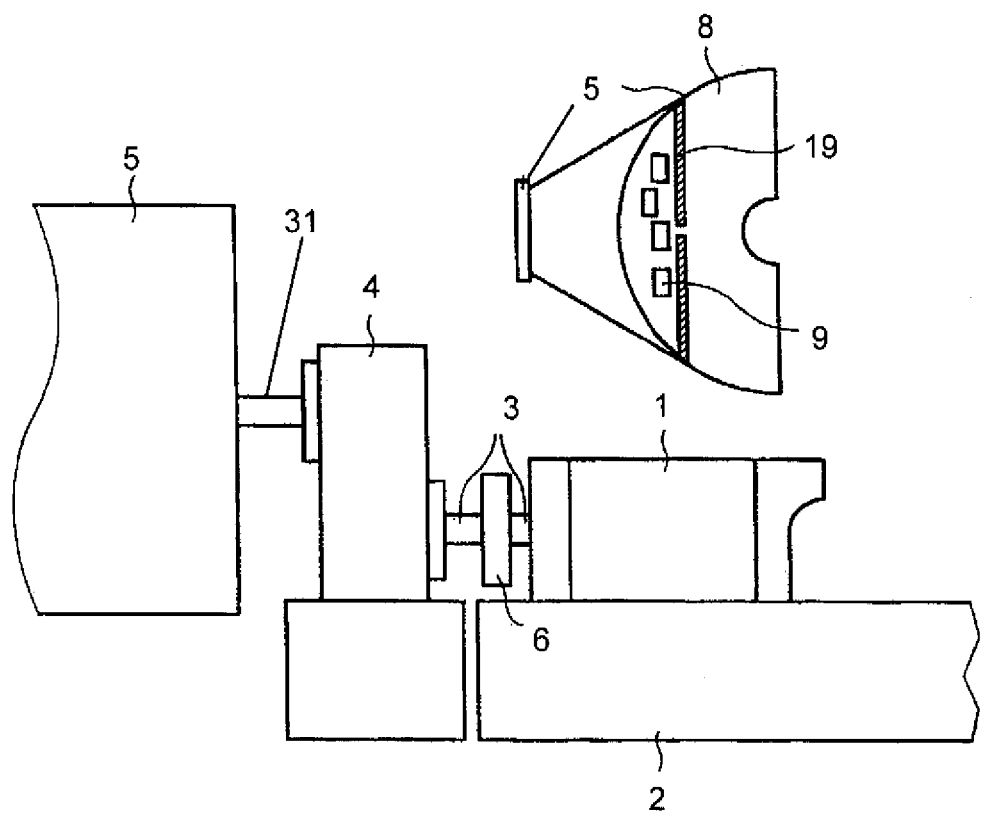
FIG. 1 shows a cross-section through a motor with coupling and a sensor for measuring a bearing voltage according to the present invention.
Figure 3:
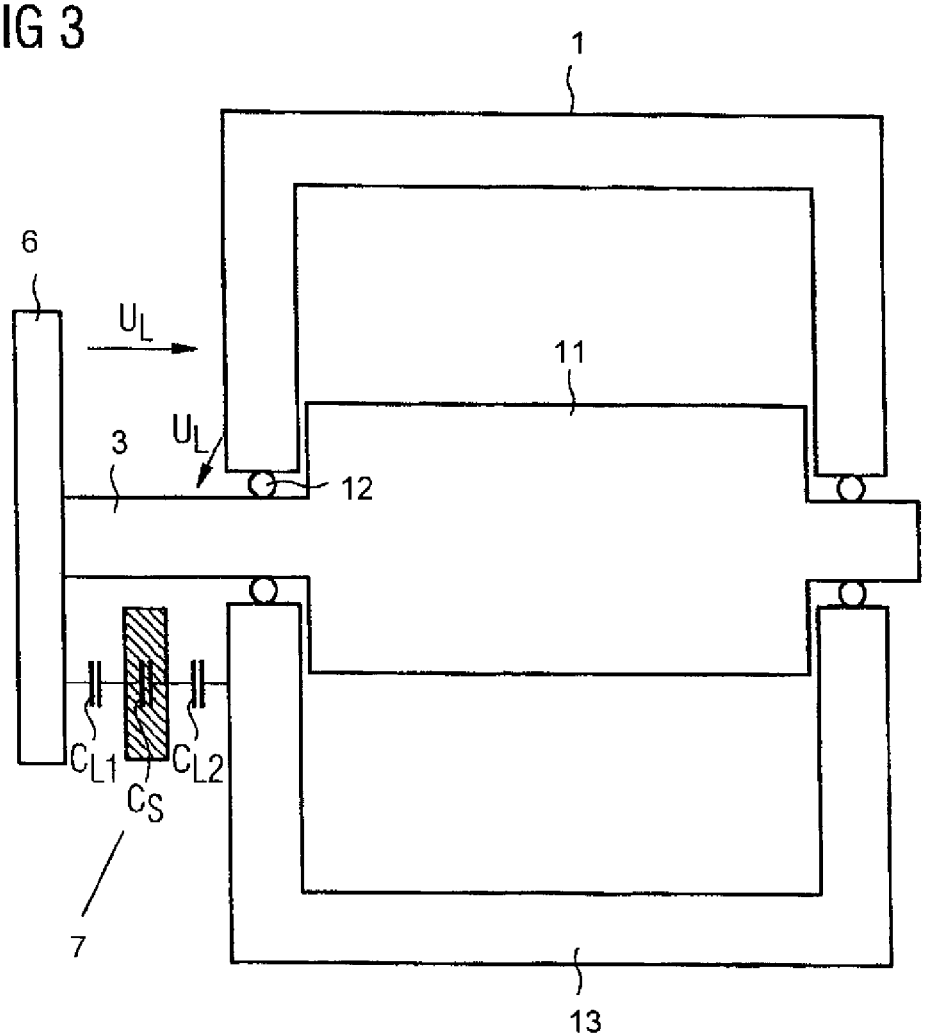
FIG. 3 shows a cross-section through a motor bearing with an equivalent circuit of the sensor according to the present invention.

FIG. 1 shows a cross-section through a normal layout with a motor 1 which is mounted on a pedestal 2. The motor 1 is connected via a motor shaft 3 and a coupling 6 to a transmission 4 which drives a working machine 5 (for example a roller) via a further shaft 31. The bearing voltage is present between motor shaft 3 and motor housing 13 (FIG. 3). As a result of the usually large diameter of the motor shaft, of the associated low inductivity for a high-frequency current as well as the small distance between motor coupling and motor housing, the voltages between motor 1 and coupling 6 and also between motor 1 and housing 13 are approximately the same. This results from the fact that the motor-side part of the coupling as a rule is connected conductively to the motor shaft.

This arrangement is similar to a plate capacitor. In conjunction with a two-sided insulation plate with good electrical conductivity (e.g. a metalized circuit board, or a similar structure which is equivalent in its effect to a plate capacitor) this allows a series circuit of capacitors to be reconstructed.

Figure 2:
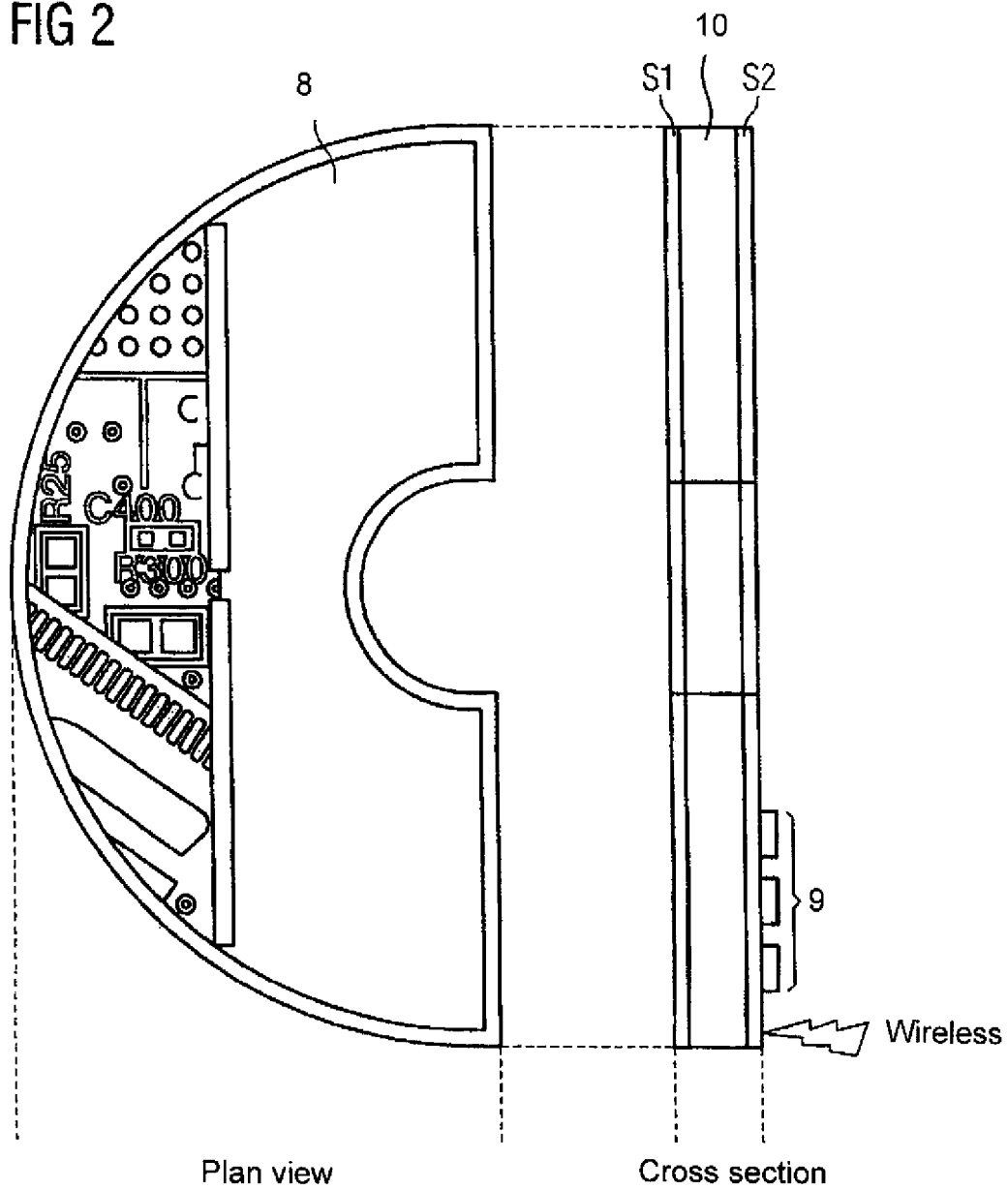
FIG. 2 shows a schematic diagram in plan view (left-hand side) and in cross section (right-hand side) of the sensor according to the present invention.

The circuit board 8 can advantageously be used at the same time for the realization of a bearing current measurement circuit 9. FIG. 2 thus shows this circuit board 8 from FIG. 1 once again in detail, viewed from above on the left and in cross-section on the right. Through its specific structure this can be used for measurements into the GHz range, since no individual conductors, because of the different surge resistances, take care of an undefined high-frequency behavior. Instead the circuit board can be realized with a specific surge frequency which, by avoiding reflections, especially in the microwave frequency range, allows precise measurements.

Furthermore the energy supply can be advantageously realized. There are the following variants for this purpose for example:
Cabled supply
Power supply by means of battery or rechargeable battery
Supply via an induced voltage. In this case the rotation of the coupling relative to the motor is used. A permanent magnet generates an induced voltage in a coil using the dynamo electric principle which is used for power supply.
Supply from the measurement signal ("Energy Harvesting": for this the measurement signal, which typically lies in the range of a few volts, can be rectified.)

In a technically simple-to-realize variant the voltage charges a capacitor. If necessary the voltage can be transformed upwards by an electrical or electronic circuit. As soon as the capacitor (for example an electrolyte or a film capacitor) has stored sufficient energy, the bearing current sensor 7 carries out measurements and in doing so discharges the capacitor. Then the cycle begins again. A (usually longer) charge time alternates with a (usually shorter) measurement time.

In another variant the electronics of the bearing current sensor 7 is designed to be especially power-saving. Then the voltage at the measurement capacitor in the lower frequency range, e.g. by series connection of a lowpass filter (for example with 1 MHz limit frequency), is taken without impermissible falsification of the measurement signal. This is possible because the measurement signal of the bearing current sensor 7, especially in the high-frequency range, is significant for assessing the bearing-damaging effect.

FIG. 3 shows a cross section through a motor bearing with an inventive bearing current sensor 7. The voltage $U_L$ across the motor bearing 12 is likewise present approximately between the motor side of the coupling 6 and the motor housing 13. Together with the motor housing 13 the coupling 6 forms a plate capacitor. By insertion of a circuit board 8 metalized on both sides a series circuit of capacitors is produced: $C_{L1}$ is the air capacitor between coupling 6 and the coupling-side metallization S1 of the circuit board 8. $C_s$ is the inserted capacitor with the dielectric, e.g. FR4 circuit board material. $C_{L2}$ is the air capacitor between the motor-side metallization S2 and the motor housing 13. A proportional relationship between bearing voltage $U_L$ and voltage at the measurement capacitor $C_s$ is produced thereby:

$$U_{cs} = k_s * U_L$$

This embodiment is especially installation-friendly because the sensor 7 can be installed below a safety hood possibly mounted between motor 1 and coupling 6. When a manual probe is used there is also no need to reach above a rotating shaft.

It is also advantageous that the measurement signal is relatively insensitive to tolerances at the mounting position. If the board 8 is installed slightly off-center, $C_{L1}$ becomes slightly larger for example, while $C_{L2}$ becomes smaller. This to some extent compensates for this.

In an alternative embodiment the sensor 7 lies on one side either on the coupling 6 or the motor 1. $C_{L1}$ or $C_{L2}$ is then omitted. The principle method remains the same however, except that the measurement is then no longer floating, which can possibly have a negative effect on the interference immunity.

In a few cases the coupling 6 is not suitable for measurement. This is the case for example when the coupling is too small or is too far away. In these cases a metal disk can be mounted on the shaft which takes over the function of the plate capacitor or conversely the potential of the motor housing can be conducted by attaching it closer to the coupling disk (which has the advantage that this is even possible with a rotating shaft).

For a portable version part of the circuit board is able to be embodied as a handle.

Further advantageous exemplary embodiments of the invention for calibration are described below:

For an automatic path measurement the sensor measures the path between the coupling and sensor and between motor and sensor, using an optical or acoustic method for example. On the basis of the distances the capacitances involved and thus the conversion factor between bearing voltage and voltage at the measurement capacitor can be calculated automatically.

For a manual path measurement the service personnel who are installing the sensor use the sensor as a hand-held device and determine the spacings given above between coupling or motor and sensor manually, e.g. by measuring stick. This data is notified to the sensor system and stored permanently. The conversion factor is calculated in a similar manner to the automatic path measurement.

In a third variant, the automatic capacitive self-calibration, the sensor directly measures the effect of the air capacitance over a defined test signal. For example a harmonic circuit which contains the capacitance of the measurement capacitor and an inductance oscillates at a specific frequency. The harmonic circuit is tuned by the external capacitance (the air gap capacitors) and oscillates at another frequency. According to the prior art this frequency is able to be measured very precisely and at lower cost. On the basis of the change of frequency and the known capacitance of the measurement capacitor the external capacitance can be deduced and thus the conversion factor between the voltage at the measurement capacitor and the bearing voltage can be calibrated. Here too the values are determined either once with permanent storage or before defined measurements.

The sensor itself can for example detect and quantify bearing currents on the basis of the voltage collapses of the surge voltage. External networking and processing is desirable. The sensor data can be transmitted wirelessly, over a cable, by transportable memory card or by reading out a display for digital data processing. There the measurement data is evaluated automatically for example and presented in a histogram. The operation of the system can be assessed in this way after maintenance, e.g. in relation to grounding measures of the motor being carried out correctly when the system is rebuilt. This prevents major economic damage for the operator of the system.

Different configurations are shown in FIGS. 4a to 4e, in which the inventive method or the inventive device for detection of bearing currents can be used.

Figure 4A:
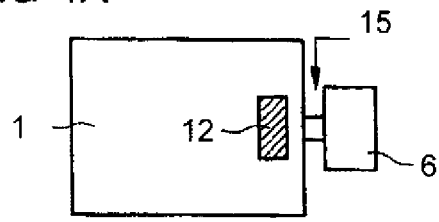
FIGS. 4a to 4e show possible locations of the measurement gap used with the sensor according to the invention.
Figure 4B:
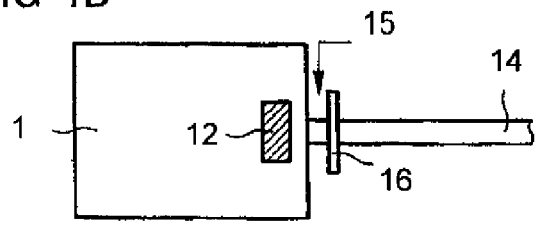
Figure 4C:
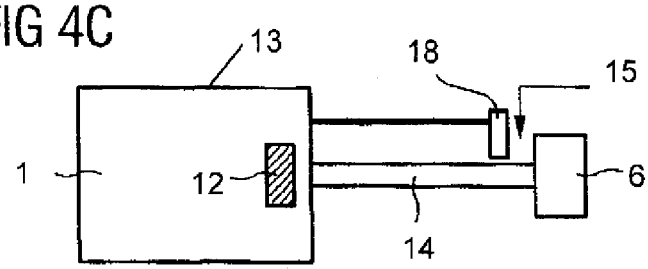
Figure 4D:
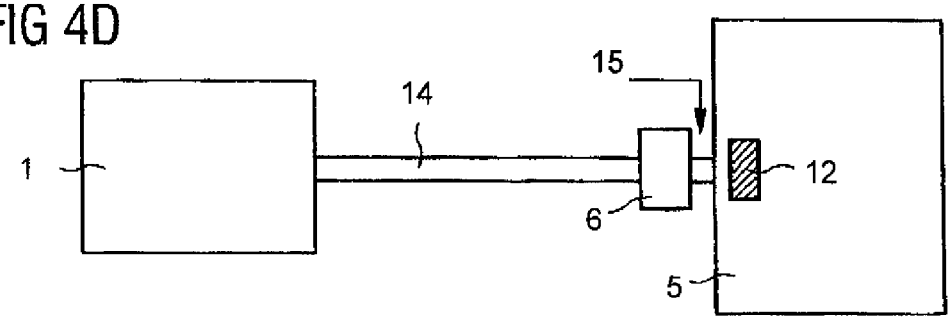
Figure 4E:
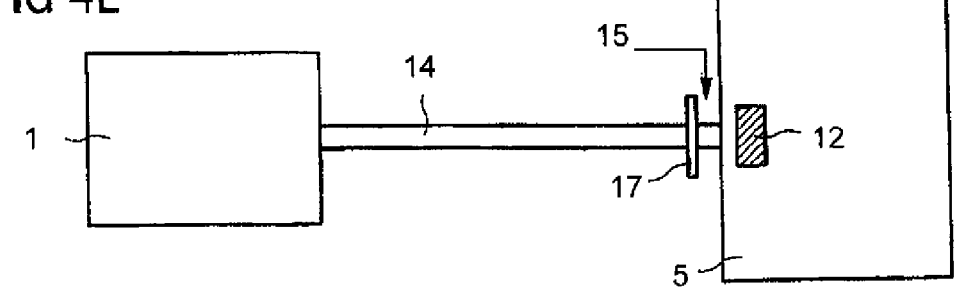

In all figures the drive motor 1 is located on the left-hand side. A shaft 14 emerges from this motor 1. In FIGS. 4a to 4c the bearing 12 involved is in the motor 1. In FIGS. 4d and 4e by contrast the bearing 12 is in the working machine 5 on the right to be driven.

FIG. 4a shows a simple layout in which the measuring gap 15 lies between the motor 1 and coupling 6, as is already shown in FIG. 3.

In FIG. 4b the measuring gap 15 is created by a disk 16 fitted to the shaft 14 instead of a coupling.

Should the distance between motor 1 and coupling 6 become too large this can be made smaller by a supplementary attachment 18 with a connection to the motor housing 13, as is shown in FIG. 4c.

The bearing current can be also measured at the other end of the shaft 14, at the working machine 5, instead of at the motor 1. For this, in a similar manner to FIG. 4a, the gap 15 between coupling 12 and working machine 5 in FIG. 4d is used. As in FIG. 4b, in FIG. 4e a suitable measuring gap 15 is provided by a disk 17 attached to the shaft 14.

The invention claimed is:

1. A device for detecting a bearing voltage across a bearing supporting a shaft, wherein the shaft is connected to an electric motor and wherein a measuring gap is formed between a first element attached to the shaft and a second element being attached to or being part of the electric motor or a working machine driven by the shaft, the device comprising:

at least one board arranged in the measuring gap and having
a first electrically conductive layer facing the first element,
a second electrically conductive layer facing the second element,
a central insulation layer disposed between the first layer and the second layer, and
a measuring circuit connected between the first conductive layer and the second conductive layer measuring a voltage produced across a first capacitance formed between the first conductive layer and the second conductive layer, wherein the produced voltage is related to a bearing voltage.

2. The device of claim 1, wherein the first capacitance formed between the first conductive layer and the second conductive layer is connected in series with a second capacitance formed between the first element and the first electrically conductive layer and a third capacitance formed between the second element and the second electrically conductive layer.

3. The device of claim 1, wherein the characteristic impedance of lines from the first capacitance is defined.

4. The device of claim 1, wherein the device is supplied with energy from an energy accumulator.

5. The device of claim 1, wherein the device is supplied with energy from a battery.

6. The device of claim 1, wherein the device is supplied with energy through inductive coupling.

7. The device of claim 4, wherein the energy accumulator is a capacitor, and wherein the capacitor is charged in a charge phase and supplies energy to the device in a measurement phase.

8. The device of claim 1, wherein the measuring circuit is constructed to save power, with energy for powering the measuring circuit being drawn from a measurement signal.

9. The device of claim 8, further comprising a low-pass filter connected in parallel with the measuring circuit.

10. The device of claim 1, wherein the produced voltage is measured by non-contact measurement.

11. The device of claim 1, wherein the device is calibrated by an automatic distance measurement measuring at least one of a first distance between the first element and the first electrically conductive layer and a second distance between the second element and the second electrically conductive layer.

12. The device of claim 1, wherein the device is automatically self-calibrating based on a test signal.

13. The device of claim 1, wherein the board is a circuit board.

14. The device of claim 1, wherein the first element comprises a coupling and the second element comprises the electric motor or a housing of the electric motor.

15. The device of claim 1, wherein the first element comprises a disk attached to the shaft and the second element comprises the electric motor or a housing of the electric motor.

16. The device of claim 1, wherein the first element comprises a coupling and the second element comprises a supplementary attachment connected to a housing of the electric motor.

17. The device of claim 1, wherein the first element comprises a coupling and the second element comprises the working machine.

18. The device of claim 1, wherein the first element comprises a disk attached to the shaft and the second element comprises the working machine.

19. A method for detecting a bearing voltage across a bearing supporting a shaft, wherein the shaft is connected to an electric motor and wherein a measuring gap is formed between a first element attached to the shaft and a second element being attached to or being part of the electric motor or a working machine driven by the shaft, the method comprising:

providing at least one board having a first electrically conductive layer facing the first element, a second electrically conductive layer facing the second element, and a central insulation layer disposed between the first layer and the second layer, inserting the board in the measuring gap, and connecting a measuring circuit between the first conductive layer and the second conductive layer and measuring a voltage produced across a first capacitance formed between the first conductive layer and the second conductive layer, wherein the produced voltage is related to a bearing voltage.

20. The method of claim 19, wherein the first capacitance formed between the first conductive layer and the second conductive layer is connected in series with a second capacitance formed between the first element and the first electrically conductive layer and a third capacitance formed between the second element and the second electrically conductive layer.

21. The method of claim 19, wherein the device is supplied with energy from an energy accumulator.

22. The method of claim 19, wherein the device is supplied with energy from a battery.

23. The method of claim 19, wherein the device is supplied with energy through inductive coupling.

24. The method of claim 19, wherein the energy accumulator is a capacitor, and wherein the capacitor is charged in a charge phase and supplies energy to the device in a measurement phase.

25. The method of claim 19, wherein the measuring circuit has a power-saving mode and is powered by a measurement signal.

26. The method of claim 19, wherein the produced voltage is measured by non-contact measurement.

27. The method of claim 19, wherein the device is calibrated by an automatic distance measurement measuring at least one of a first distance between the first element and the first electrically conductive layer and a second distance between the second element and the second electrically conductive layer.

28. The method of claim 19, wherein the device is automatically self-calibrating based on a test signal.

* * * * *